US011522536B2

(12) United States Patent
Yu et al.

(10) Patent No.: US 11,522,536 B2
(45) Date of Patent: Dec. 6, 2022

(54) SWITCH CAPABLE OF DECREASING PARASITIC INDUCTANCE

(71) Applicant: Richtek Technology Corporation, Zhubei (TW)

(72) Inventors: Kun-Huang Yu, Hsinchu (TW); Chien-Yu Chen, Kaohsiung (TW); Ting-Wei Liao, Taichung (TW); Wu-Te Weng, Hsinchu (TW); Chien-Wei Chiu, Yunlin (TW); Yong-Zhong Hu, Hsinchu (TW); Ta-Yung Yang, Taoyuan (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 17/568,637

(22) Filed: Jan. 4, 2022

(65) Prior Publication Data

US 2022/0224325 A1 Jul. 14, 2022

Related U.S. Application Data

(60) Provisional application No. 63/135,459, filed on Jan. 8, 2021.

(30) Foreign Application Priority Data

Apr. 27, 2021 (TW) .................................. 110115186

(51) Int. Cl.
*H03K 17/00* (2006.01)
*H03K 17/16* (2006.01)
*H03K 17/687* (2006.01)

(52) U.S. Cl.
CPC ......... *H03K 17/161* (2013.01); *H03K 17/687* (2013.01); *H03K 2217/0036* (2013.01)

(58) Field of Classification Search
None
See application file for complete search history.

(56) References Cited

U.S. PATENT DOCUMENTS

| 4,760,833 A * | 8/1988 | Tatyrek ................ F01M 13/023 123/574 |
| 2010/0283116 A1* | 11/2010 | Shimizu .............. H01L 27/0629 257/500 |
| 2011/0298446 A1* | 12/2011 | Shiraki ................. H01L 23/585 257/E29.166 |
| 2013/0222045 A1* | 8/2013 | Wu ...................... H01L 23/3675 257/E29.345 |
| 2021/0391311 A1* | 12/2021 | Rhodes ................ H01L 25/072 |

* cited by examiner

*Primary Examiner* — Tuan T Lam
(74) *Attorney, Agent, or Firm* — Tung & Associates

(57) ABSTRACT

A switch capable of decreasing parasitic inductance includes: a semiconductor device, a first top metal line, and a second top metal line. The second top metal line electrically connects a power supply input end and a current inflow end of the semiconductor device, wherein a first part of the first top metal line is arranged in parallel and adjacent to a second part of the second top metal line. When the semiconductor device is in an ON operation, an input current outflows from the power supply input end, and is divided into a first current and a second current. When the first current and the second current flow through the first part and the second part respectively, the first current and the second current flow opposite to each other, to reduce an total parasitic inductance of the first top metal line and the second top metal line.

10 Claims, 13 Drawing Sheets

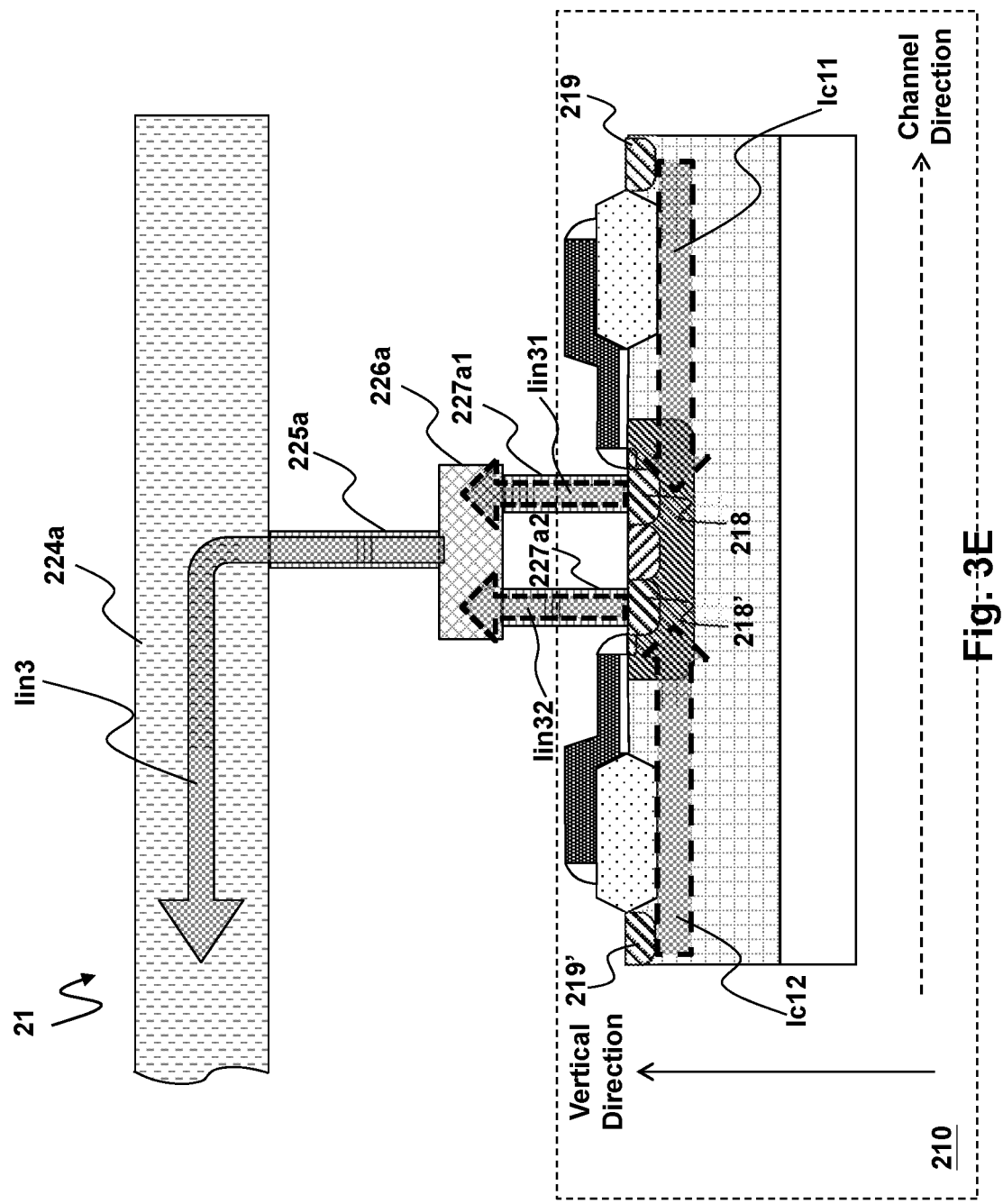

SWITCH CAPABLE OF DECREASING PARASITIC INDUCTANCE

CROSS REFERENCE

The present invention claims priority to U.S. 63/135,459 filed on Jan. 8, 2021 and claims priority to TW 110115186 filed on Apr. 27, 2021.

BACKGROUND OF THE INVENTION

Field of Invention

The present invention relates to a switch capable of decreasing parasitic inductance; particularly, it relates to such switch for use in a switching regulator.

Description of Related Art

Please refer to FIG. 1, which shows a schematic circuit diagram of a conventional buck switching regulator 10. The conventional buck switching regulator 10 includes: a control circuit 1 and a power stage circuit 2. As shown in FIG. 1, the power stage circuit 2 includes an upper gate switch 11, a lower gate switch 12 and an inductor 13. The upper gate switch 11 and the lower gate switch 12 operate according to an upper gate signal UG and a lower gate signal LG, respectively, to convert an input voltage Vin to an output voltage Vout and to generate an inductor current IL flowing through the inductor 13 via a phase node PH, so as to supply electrical power to the load circuit 3.

FIG. 2A shows a top view of a conventional semiconductor device configured to serve as an upper gate switch in a power stage of a switching regulator. FIG. 2B shows a cross sectional view of the conventional semiconductor device taken along A-A' line of FIG. 2A. FIG. 2C shows a cross sectional view of the conventional semiconductor device taken along B-B' line of FIG. 2A. Please refer to FIG. 1 in conjugation with FIG. 2A and FIG. 2B. When the upper gate switch 11 is ON (i.e., a gate 117 of a semiconductor device 110 of the upper gate switch 11 is electrically connected to a high-level voltage), an input current Iin outflows from a power supply input end 120, and the input current Iin is divided into sub-currents Iin11 and Iin12. As shown in FIG. 2B, the sub-current Iin11 flows from a metal line 121 through a metal plug 122a and a metal line 123a, to a drain 119. On the other hand, the sub-current Iin12 flows from the metal line 121 through a metal plug 122b and a metal line 123b, to a drain 119'. When the upper gate switch 11 remains ON, a conduction current Ic1 flows from the drain 119 through a channel formed within the semiconductor layer, to a source 118, and subsequently, the conduction current Ic1 flows from the source 118 through a metal plug 127a, a metal line 126, to a metal plug 125. Also, when the upper gate switch 11 remains ON, a conduction current Ic2 flows from the drain 119' through a channel formed within the semiconductor layer, to a source 118', and subsequently, the conduction current Ic2 flows from the source 118' through a metal plug 127b, the metal line 126, to the metal plug 125. The conduction current Ic1 and the conduction current Ic2 merge to become the inductor current IL. Eventually, the inductor current IL flows to the phase node PH via a metal line 124.

The prior art shown in FIG. 2A has the following drawback. In order to reduce the manufacture cost and enhance the operation efficiency, the prior art reduces the size of the upper gate switch 11 by arranging the metal line 121 and the metal line 124 to be adjacent to and close to each other as much as possible. However, according to Ampere's circuital law, when the upper gate switch 11 is ON, because the input current Iin flowing through the metal line 121 and the inductor current IL flowing through the metal line 124 (which is in parallel to the metal line 121) flow along the same direction (from the top view of FIG. 2A, the input current Iin and the inductor current IL both flow from right to left, as shown by the dashed hollow arrow in FIG. 2A), the parasitic inductance generated by the input current Iin and the parasitic inductance generated by the inductor current IL have the same direction; hence, the total of the parasitic inductance generated by the input current Iin and the parasitic inductance generated by the inductor current IL will undesirably limit the slew rate of the upper gate switch 11.

In view of the above, to overcome the drawback in the prior art, the present invention proposes a switch capable of decreasing the parasitic inductance in a metal line.

SUMMARY OF THE INVENTION

From one perspective, the present invention provides a switch capable of decreasing parasitic inductance, comprising: a semiconductor device, which is configured to electrically connect a current inflow end of the semiconductor device with a current outflow end of the semiconductor device according to a control voltage, so as to turn ON the semiconductor device; a first top metal line, which is configured to electrically connect a power supply input end and the current inflow end; and a second top metal line, which is configured to electrically connect the power supply input end and the current inflow end, wherein the second top metal line and the first top metal line are formed at a same elevation level, and wherein a first part of the first top metal line is arranged in parallel and adjacent to a second part of the second top metal line; wherein when the semiconductor device is in an ON operation, an input current outflows from the power supply input end, and the input current is divided into a first current and a second current; wherein the first current and the second current flow through the first part and the second part, respectively, and wherein when the first current and the second current flow through the first part and the second part, respectively, the first current and the second current flow opposite to each other, to reduce a first total parasitic inductance of the first top metal line and the second top metal line.

In one embodiment, the switch capable of decreasing parasitic inductance further comprises: a third top metal line, which is configured to electrically connect the current outflow end and a node; and a fourth top metal line, which is configured to electrically connect the current outflow end and the node, wherein the fourth top metal line and the third top metal line are formed at a same elevation level, and wherein a third part of the third top metal line is arranged in parallel and adjacent to a fourth part of the fourth top metal line; wherein when the semiconductor device is in the ON operation, a conduction current outflows from the current outflow end, and the conduction current is divided into a third current and a fourth current; wherein the third current and the fourth current flow through the third part and the fourth part, respectively, and wherein when the third current and the fourth current flow through the third part and the fourth part, respectively, the third current and the fourth current flow opposite to each other, to reduce a second total parasitic inductance of the third top metal line and the fourth top metal line.

In one embodiment, the third top metal line and the second top metal line are formed at a same elevation level, and wherein the third part of the third top metal line is arranged in parallel and adjacent to the second part of the second top metal line; wherein when the third current and the second current flow through the third part and the second part, respectively, the third current and the second current flow opposite to each other, to reduce a third total parasitic inductance of the third top metal line and the second top metal line.

In one embodiment, the switch is an upper gate switch in a buck switching regulator.

In one embodiment, the switch is a lower gate switch in a boost switching regulator.

In one embodiment, the semiconductor device is a lateral diffused metal oxide semiconductor (LDMOS) device.

In one embodiment, the LDMOS device includes: a well, which has a first conductivity type, and is formed in a semiconductor layer; a body region, which has a second conductivity type, and is formed in the semiconductor layer, wherein the body region is connected to the well in a channel direction; a gate, which is formed on the semiconductor layer, wherein part of the body region is vertically below the gate and is connected to the gate, so as to form an inversion current channel in the ON operation of the semiconductor device; a source and a drain, which have the first conductivity type, and are located at different sides out of the gate, respectively, wherein the source is located in the body region, and the drain is located in the well; wherein part of the well between the body region and the drain is a drift region, which serves as a drift current channel in the ON operation of the semiconductor device.

In one embodiment, the first top metal line, the second top metal line, the third top metal line and the fourth top metal line are formed at a same elevation level; and wherein the power supply input end and the node are formed at a same elevation level.

In one embodiment, the semiconductor device includes: a first LDMOS device and a second LDMOS device, wherein the first LDMOS device and the second LDMOS device shared a same body region and a same body contact, and wherein the first LDMOS device and the second LDMOS device are mirror arranged to each other.

In one embodiment, from a top view, in a channel direction, the first top metal line and the second top metal line extend across the wells, the body regions, the body contacts, the gates, the sources and the drains of the first LDMOS device and the second LDMOS device.

One advantage of the present invention is that, the present invention can decrease unwanted parasitic inductance in a metal line.

The objectives, technical details, features, and effects of the present invention will be better understood with regard to the detailed description of the embodiments below, with reference to the attached drawings.

BRIEF DESCRIPTION OF THE DRAWINGS

FIG. 3E shows a cross sectional view of a switch capable of decreasing parasitic inductance taken along E-E' line of FIG. 3A.

DESCRIPTION OF THE PREFERRED EMBODIMENTS

The drawings as referred to throughout the description of the present invention are for illustration only, to show the interrelations among the process steps and the layers, but the shapes, thicknesses, and widths are not drawn in actual scale.

Figure 1:
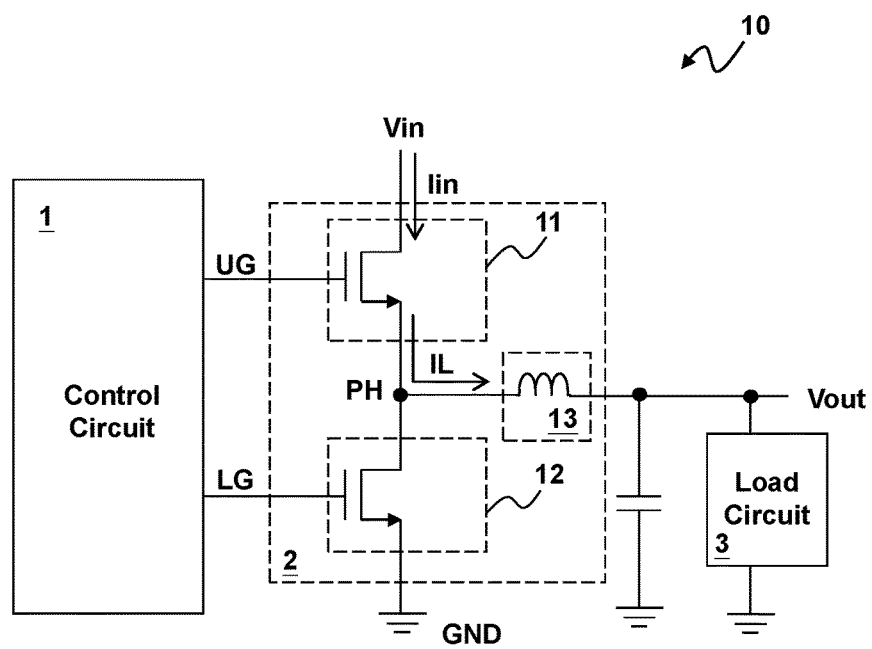
FIG. 1 shows a schematic circuit diagram of a conventional buck switching regulator.
Figure 2A:
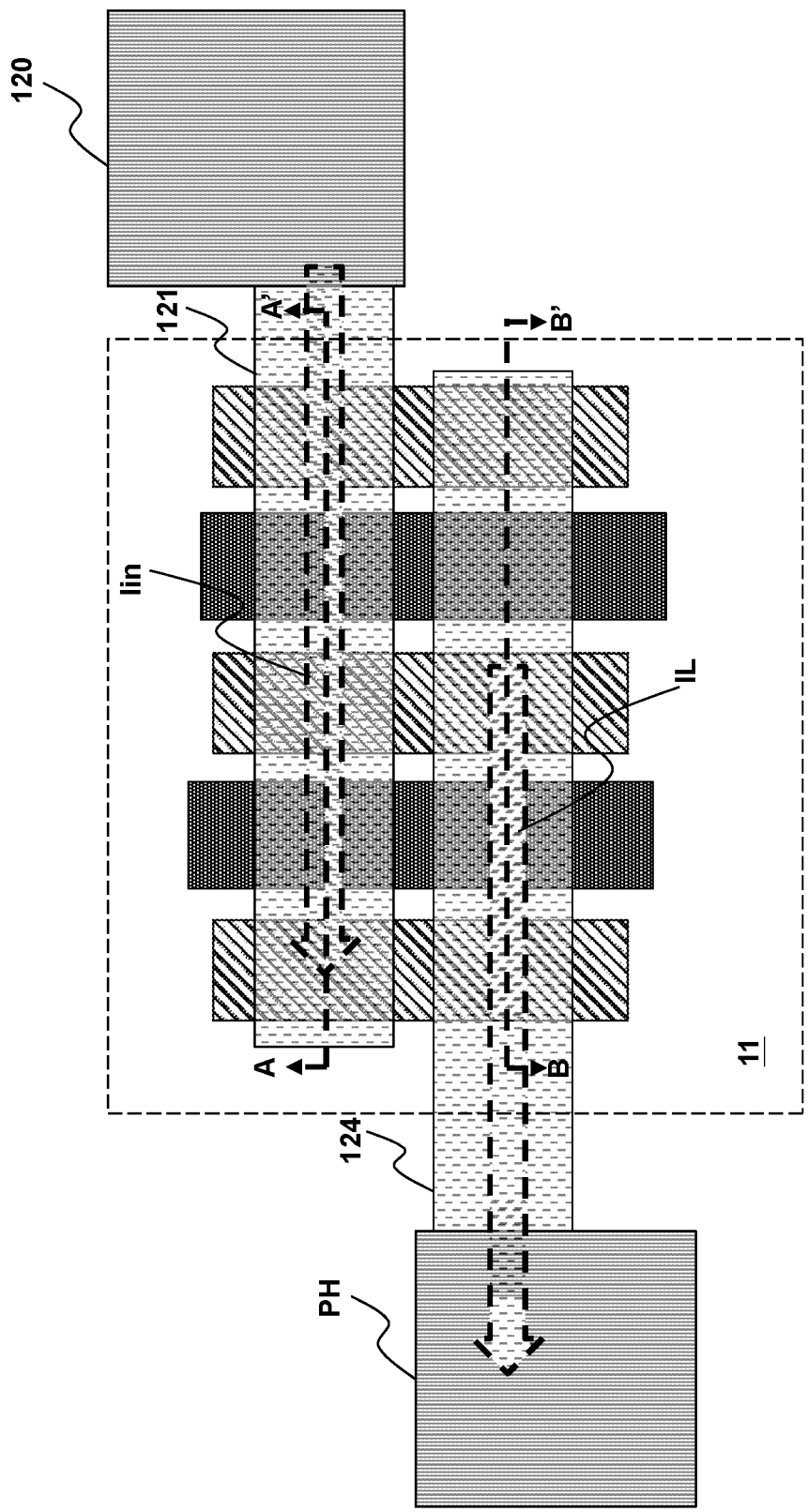
FIG. 2A shows a top view of a conventional semiconductor device configured to serve as an upper gate switch in a power stage of a conventional switching regulator.
Figure 2B:
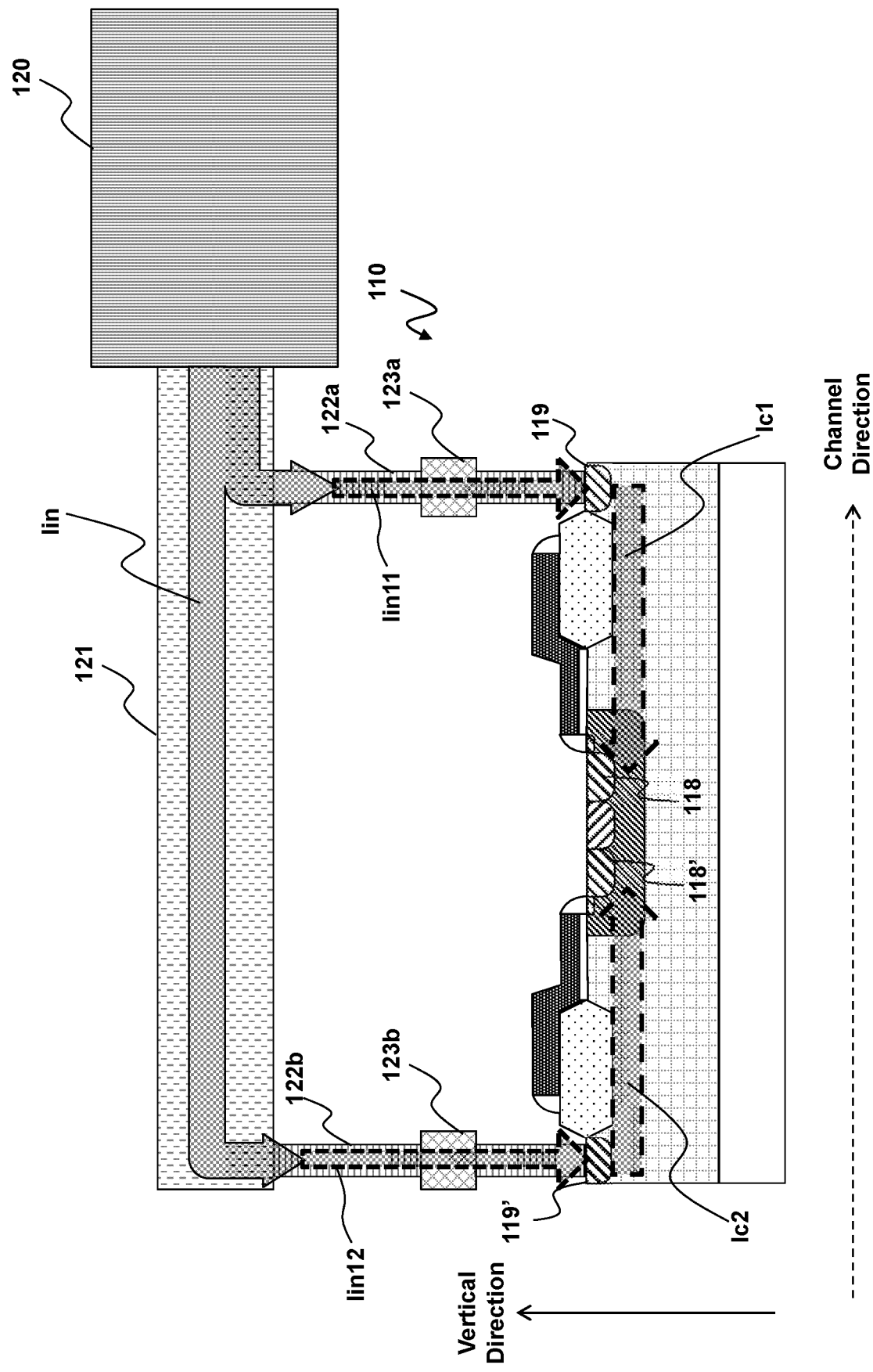
FIG. 2B shows a cross sectional view of a conventional semiconductor device taken along A-A' line of FIG. 2A.
Figure 2C:
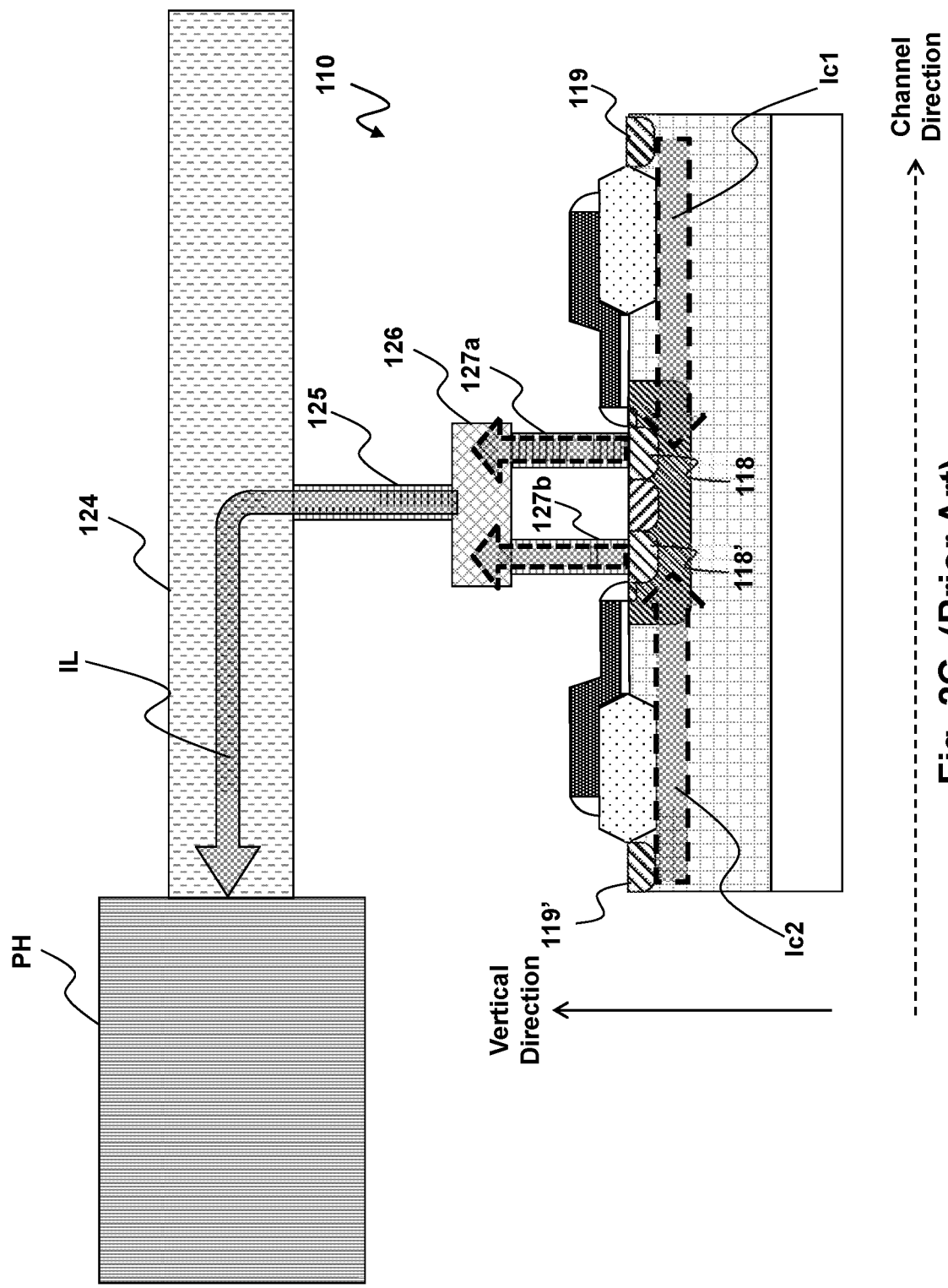
FIG. 2C shows a cross sectional view of a conventional semiconductor device taken along B-B' line of FIG. 2A.
Figure 3A:
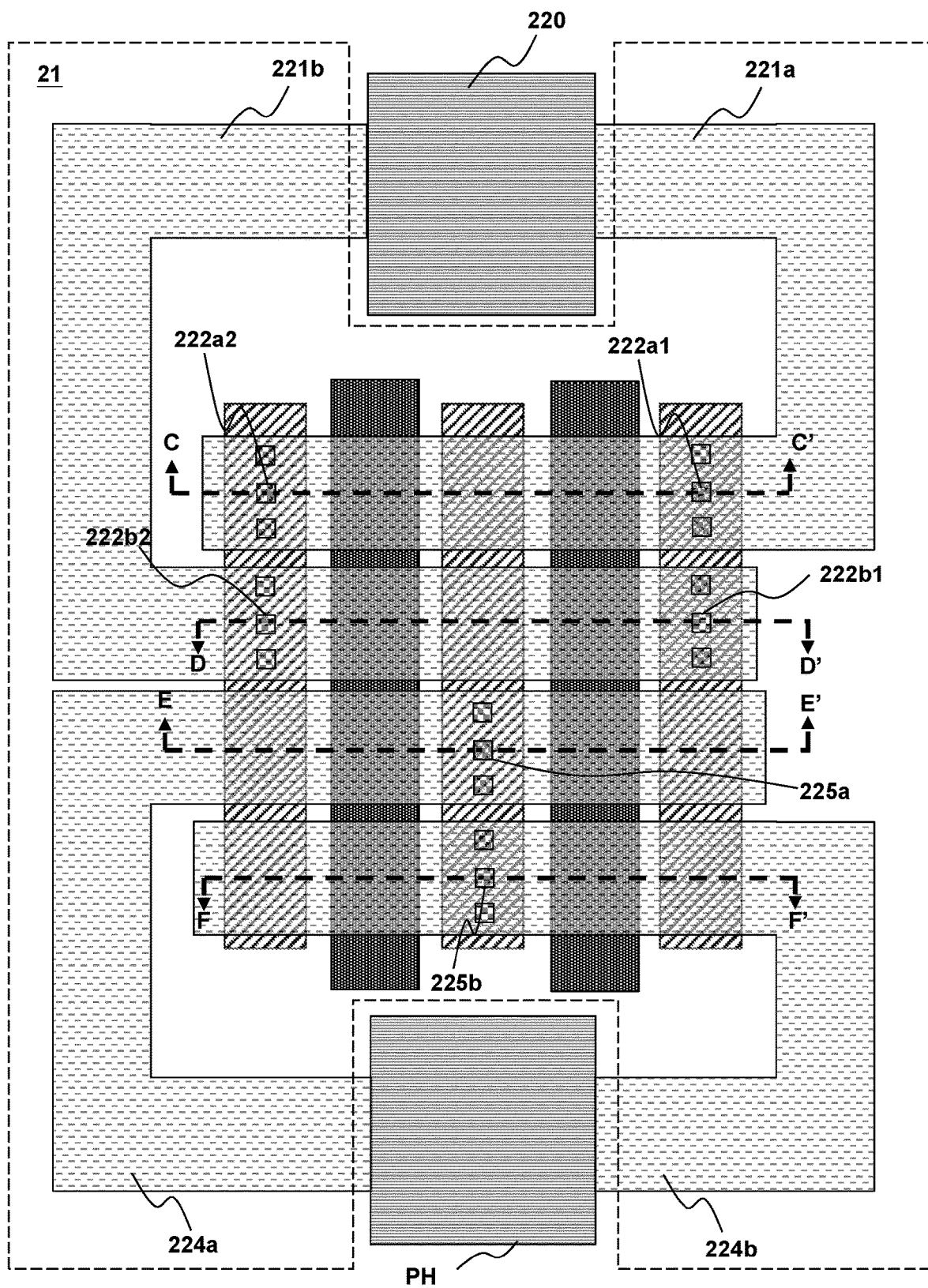
FIG. 3A shows a top view of a switch capable of decreasing parasitic inductance according to an embodiment of the present invention.
Figure 3B:
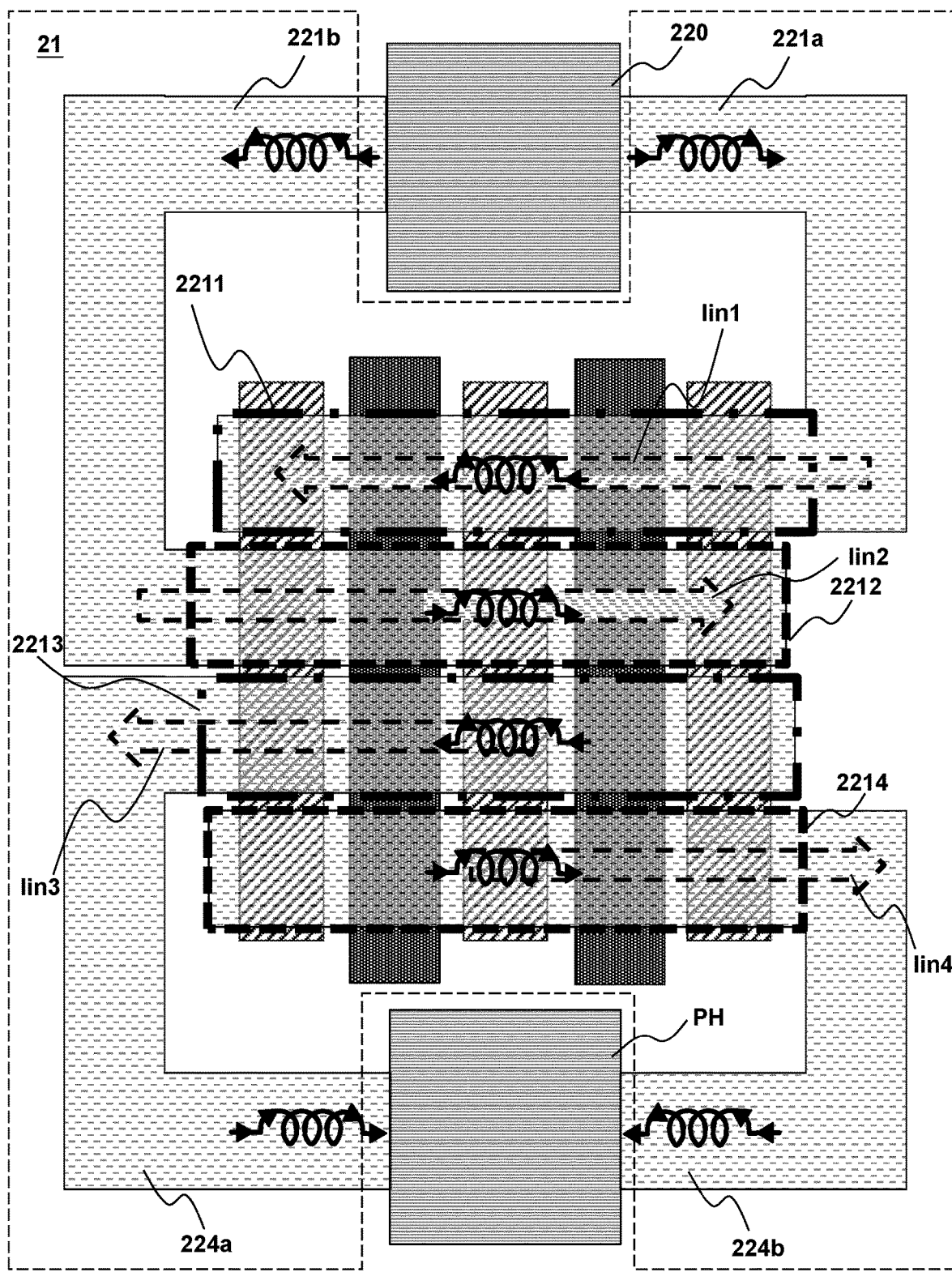
FIG. 3B shows a top view of a switch capable of decreasing parasitic inductance according to an embodiment of the present invention.
Figure 3C:
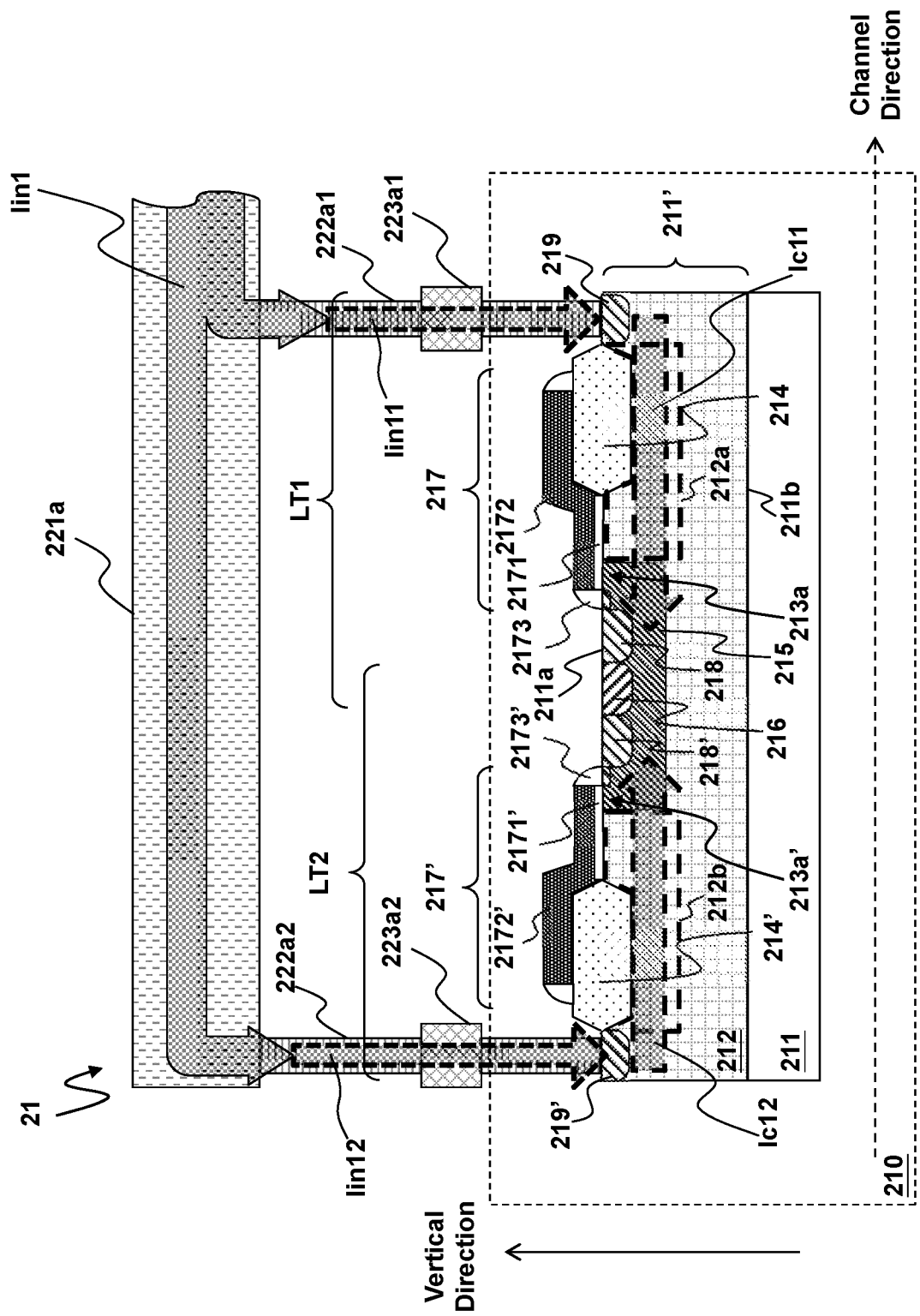
FIG. 3C shows a cross sectional view of a switch capable of decreasing parasitic inductance taken along C-C' line of FIG. 3A.
Figure 3D:
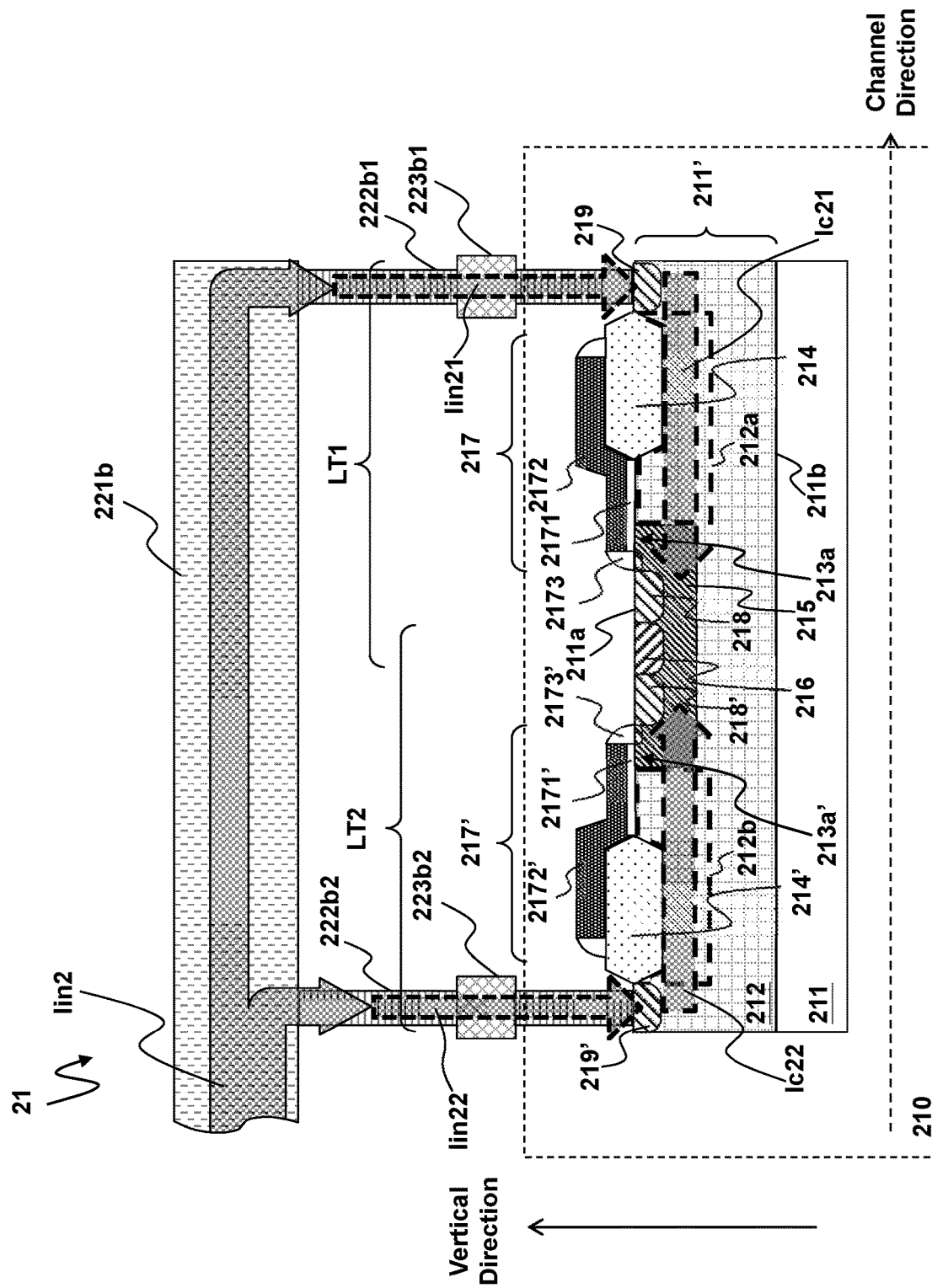
FIG. 3D shows a cross sectional view of a switch capable of decreasing parasitic inductance taken along D-D' line of FIG. 3A.

FIG. 3A and FIG. 3B show two top views of a switch 21 capable of decreasing parasitic inductance according to an embodiment of the present invention. FIG. 3C shows a cross sectional view of the switch 21 taken along C-C' line of FIG. 3A. FIG. 3D shows a cross sectional view of the switch 21 taken along D-D' line of FIG. 3A.

Please refer to FIG. 3A and FIG. 3B in conjugation with FIG. 3C and FIG. 3D. As shown in FIG. 3A and FIG. 3B, the switch 21 capable of decreasing parasitic inductance of the present invention includes: a semiconductor device 210, a first top metal line 221a and a second top metal line 221b. Please refer to FIG. 3A in conjugation with FIG. 3C. The first top metal line 221a is configured to electrically connect a power supply input end 220 and a current inflow end of the semiconductor device 210 (e.g., a drain 219 and a drain 219'). Please refer to FIG. 3A in conjugation with FIG. 3D. The second top metal line 221b is also configured to electrically connect the power supply input end 220 and the current inflow end (e.g., the drain 219 and the drain 219'). In one embodiment, the second top metal line 221b and the first top metal line 221a are formed at a same elevation level. In one embodiment, as shown in FIG. 3B, a first part 2211 (for example but not limited to, as shown by an uppermost thick black dot-dashed frame in FIG. 3B) of the first top metal line 221a is arranged in parallel and adjacent to a second part 2212 (for example but not limited to, as shown by a second uppermost thick black dashed frame in FIG. 3B) of the second top metal line 221b.

As shown in FIG. 3A, when the semiconductor device 210 is in an ON operation, an input current outflows from the power supply input end 220, and the input current is divided into a first current Iin1 and a second current Iin2. The first current Iin1 and the second current Iin2 flow through the first part 2211 and the second part 2212, respectively. And, when the first current Iin1 and the second current Iin2 flow through the first part 2211 and the second part 2212, respectively, because the first current Iin1 and the second current Iin2 flow opposite to each other, the parasitic inductance generated by the first current Iin1 has an opposite direction with respect to the parasitic inductance generated by the second current Iin2. As a result, the parasitic inductance generated by the first current Iin1 and the parasitic inductance generated by the second current Iin2 can cancel each other, thus reducing a first total parasitic inductance of the first top metal line 221a and the second top metal line 221b, and to thereby improve the slew rate of the switch 21.

As shown in FIG. 3A, in one embodiment, the switch 21 further comprises: a third top metal line 224a and a fourth top metal line 224b. Please refer to FIG. 3E, which shows a cross sectional view of the switch 21 taken along E-E' line of FIG. 3A. Please refer to FIG. 3E in conjugation with FIG. 3A. The third top metal line 224a is configured to electrically connect a current outflow end of the semiconductor device 210 (e.g., a source 218 and a source 218') and a node (e.g., a phase node PH). Please refer to FIG. 3F, which shows a cross sectional view of the switch 21 taken along F-F' line of FIG. 3A. Please refer to FIG. 3F in conjugation with FIG. 3A. The fourth top metal line 224b is also configured to electrically connect the current outflow end (e.g., the source 218 and the source 218') and the node (e.g., the phase node PH). In one embodiment, the fourth top metal line 224b and the third top metal line 224a are formed at a same elevation level. As shown in FIG. 3A, a third part 2213 (for example but not limited to, as shown by a second lowermost thick black dot-dashed frame in FIG. 3B) of the third top metal line 224a is arranged in parallel and adjacent to a fourth part 2214 (for example but not limited to, as shown by a lowermost thick black dashed frame in FIG. 3B) of the fourth top metal line 224b.

As shown in FIG. 3A, when the semiconductor device 210 is in the ON operation, a conduction current outflows from the current outflow end (e.g., a source 218 and a source 218'), and the conduction current is divided into a third current Iin3 and a fourth current Iin4. The third current Iin3 and the fourth current Iin4 flow through the third part 2213 and the fourth part 2214, respectively. When the third current Iin3 and the fourth current Iin4 flow through the third part 2213 and the fourth part 2214, respectively, the third current Iin3 and the fourth current Iin4 flow opposite to each other, to reduce a second total parasitic inductance of the third top metal line 224a and the fourth top metal line 224b. As shown in FIG. 3A, in one embodiment, the third top metal line 224a and the second top metal line 221b are formed at a same elevation level. As shown in FIG. 3A, in one embodiment, the third part 2213 of the third top metal line 224a is arranged in parallel and adjacent to the second part 2212 of the second top metal line 221b. As shown in FIG. 3A, when the semiconductor device 210 is in the ON operation, the third current Iin3 and the second current Iin2 flow through the third part 2213 and the second part 2212, respectively. When the third current Iin3 and the second current Iin2 flow through the third part 2213 and the second part 2212, respectively, the third current Iin3 and the second current Iin2 flow opposite to each other, to reduce a third total parasitic inductance of the third top metal line 224a and the second top metal line 221b. In one embodiment, the first top metal line 221a, the second top metal line 221b, the third top metal line 224a and the fourth top metal line 224b are all formed at a same elevation level. In one embodiment, the power supply input end 220 and the node (e.g., the phase node PH) are formed at a same elevation level. In one embodiment, the switch 21 is an upper gate switch in a buck switching regulator. In another embodiment, the switch 21 is a lower gate switch in a boost switching regulator.

FIG. 3B shows a top view of a switch 21 capable of decreasing parasitic inductance according to an embodiment of the present invention. FIG. 3B shows a parasitic inductance generated under a situation when the first current Iin1 flows through the first top metal line 221a and the direction of the generated parasitic inductance, a parasitic inductance generated under a situation when the second current Iin2 flows through the second top metal line 221b and the direction of the generated parasitic inductance, a parasitic inductance generated under a situation when the third current Iin3 flows through the third top metal line 224a and the direction of the generated parasitic inductance, and a parasitic inductance generated under a situation when the fourth current Iin4 flows through the fourth top metal line 224b and the direction of the generated parasitic inductance. As shown in FIG. 3B, the parasitic inductances mutually cancel one another, at least a significant part thereof. More specifically, the parasitic inductances generated by the following parts of the top metal lines mutually cancel each other:

1. a part of the first top metal line 221a near the power supply input end 220 and a part of the second top metal line 221b near the power supply input end 220;
2. a part of the first top metal line 221a away from the power supply input end 220 and a part of the second top metal line 221b away from the power supply input end 220;
3. a part of the third top metal line 224a near the phase node PH and a part of the fourth top metal line 224b near the phase node PH;
4. a part of the third top metal line 224a away from the phase node PH and a part of the fourth top metal line 224b away from the phase node PH;

Because the two parts described in each subparagraph above generate parasitic inductances of opposite directions, they can cancel each other, to greatly reduce the parasitic inductance.

Please refer to FIG. 3C. The switch 21 of the present invention includes a semiconductor device 210, which is configured to electrically connect the current inflow end of the semiconductor device 210 (e.g., the drain 219 and the drain 219') with the current outflow end of the semiconductor device 210 (e.g., the source 218 and the source 218') according to the control voltage, so as to turn ON the semiconductor device 210. As shown in FIG. 3C, the semiconductor device 210 includes: a lateral diffused metal oxide semiconductor (LDMOS) device LT1 and a LDMOS device LT2. The LDMOS device LT1 includes: a well 212, a drift oxide region 214, a body region 215, a body contact 216, a gate 217, a source 218, and a drain 219. The LDMOS device LT2 includes: the well 212, a drift oxide region 214', the body region 215, the body contact 216, a gate 217', a source 218', and a drain 219'. In the semiconductor device 210, the LDMOS device LT1 and the LDMOS device LT2 share the body region 215 and the body contact 216. And, the LDMOS device LT1 and the LDMOS device LT2 are mirror arranged to each other, so as to constitute the semiconductor device 210. That is, as shown in FIG. 3C, the source 218' is mirror symmetrical to the source 218, whereas, the gate 217' is mirror symmetrical to the gate 217, and so on.

In one embodiment, from a top view, in a channel direction (as indicated by the dashed arrow in FIG. 3C), the first top metal line 221a, the second top metal line 221b, the third top metal line 224a and the fourth top metal line 224b extend across the well 212, the body region 215, the body contact 216, the gate 217, the source 218 and the drain 219 of the LDMOS device LT1, and the first top metal line 221a, the second top metal line 221b, the third top metal line 224a and the fourth top metal line 224b also extend across the well 212, the body region 215, the body contact 216, the gate 217', the source 218' and the drain 219' of the LDMOS device LT2.

The semiconductor layer 211' is formed on the substrate 211. The semiconductor layer 211' has a top surface 211a and a bottom surface 211b opposite to the top surface 211a in a vertical direction (as indicated by the direction of the solid arrow in FIG. 3C). The substrate 211 is, for example but not limited to, a P-type or N-type semiconductor substrate. The semiconductor layer 211', for example, is formed on the substrate 211 by an epitaxial process step, or is a part of the substrate 211. The semiconductor layer 211' can be formed by various methods known to a person having ordinary skill in the art, so the details thereof are not redundantly explained here.

Please still refer to FIG. 3C. The drift oxide region 214 is formed on and in contact with the top surface 211a and is located on and in contact with part of a drift region 212a (as indicated by the dashed line frame indicative of the LDMOS device LT1 shown in FIG. 3C). The drift oxide region 214' is formed on and in contact with the top surface 211a and is located on and in contact with part of a drift region 212b (as indicated by the dashed line frame indicative of the LDMOS device LT2 shown in FIG. 3C). The drift oxide region 214 and the drift oxide region 214' are each for example but not limited to a local oxidation of silicon (LOCOS) structure as shown in the figure, or may be a shallow trench isolation (STI) structure or a chemical vapor deposition (CVD) structure in other embodiments.

The well 212 has the first conductivity type, and is formed in the semiconductor layer 211'. The well 212 is located beneath the top surface 211a and is in contact with the top surface 221a in the vertical direction. The well 212 is formed by for example but not limited to at least one ion implantation process step. The body region 215 has a second conductivity type, and is formed in the well 212. The body region 225 is located beneath and in contact with the top surface 211a in the vertical direction. The body contact 216 has the second conductivity type, and serves as an electrical contact of the body region 215. The body contact 216 is formed in the body region 215, beneath the top surface 211a and in contact with the top surface 211a in the vertical direction. The gate 217 is formed on the top surface 211a of the semiconductor layer 211', wherein part of the body region 215 near the top surface 211a between the source 218 and the well 212 defines an inversion region 213a, wherein the inversion region 213a is located vertical below the gate 217 and in contact with the gate 217 to provide an inversion current channel of the semiconductor device 210 during the ON operation. Likely, the gate 217' is formed on the top surface 211a of the semiconductor layer 211', wherein part of the body region 215 near the top surface 211a between the source 218 and the well 212 defines an inversion region 213a', wherein the inversion region 213a' is located vertical below the gate 217' and in contact with the gate 217' to provide an inversion current channel of the semiconductor device 210 during the ON operation.

Please still refer to FIG. 3C. The source 218 and the drain 219 have the first conductivity type. The source 218 and the drain 219 are formed beneath the top surface 211a and in contact with the top surface 211a in the vertical direction. The source 218 and the drain 219 are located at two different sides out of the gate 217, respectively, wherein in the channel direction (as indicated by the dashed arrow in FIG. 3C), the source 218 is located in the body region 215, and the drain 219 is located in the well 212 which is away from the body region 215. In the channel direction, part of the well 212 which is near the top surface 221a, and between the body region 215 and the drain 219, defines the drift region 212a. The drift region 212a serves as a drift current channel in the ON operation of the LDMOS device LT1. Likely, the source 218' and the drain 219' have the first conductivity type. The source 218' and the drain 219' are formed beneath the top surface 211a and in contact with the top surface 211a in the vertical direction. The source 218' and the drain 219' are located at two different sides out of the gate 217', respectively, wherein in the channel direction, the source 218' is located in the body region 215, and the drain 219' is located in the well 212 which is away from the body region 215. In the channel direction, part of the well 212 which is near the top surface 221a, and between the body region 215 and the drain 219, defines the drift region 212b. The drift region 212b serves as a drift current channel in the ON operation of the LDMOS device LT2.

Note that the term "inversion current channel" 213a or 213a' means thus. Taking this embodiment as an example, when the LDMOS device LT1 operates in the ON operation due to the voltage applied to the gate 217, an inversion layer is formed beneath the gate 217, between the source 218 and the drift region 212a, so that a conduction current flows through the region of the inversion layer; likely, when the LDMOS device LT2 operates in the ON operation due to the voltage applied to the gate 217', an inversion layer is formed beneath the gate 217', between the source 218' and the drift region 212b, so that a conduction current flows through the region of the inversion layer. The above is known to a person having ordinary skill in the art, so the details thereof are not redundantly explained here.

Note that the first conductivity type may be P-type or N-type, whereas the second conductivity type may be P-type or N-type; when the first conductivity type is P-type, the second conductivity type is N-type, and when the first conductivity type is N-type, the second conductivity type is P-type.

Note that the term "drift current channel" means thus. Taking this embodiment as an example, the drift region provides a region where the conduction current passes through in a drifting manner when the semiconductor device 210 operates in the ON operation, and the current path through the drift region is referred to as the "drift current channel", which is known to a person having ordinary skill in the art, so the details thereof are not redundantly explained here.

Note that the gate 217 and 217' as defined in the context of this invention includes a dielectric layer 2171 or 2171' in contact with the top surface 211a, a conductive layer 2172 or 2172' which is conductive, and a spacer layer 2173 or 2173' which is electrically insulative. The dielectric layer 2171 or 2171' is formed on the body region 215, and is in contact with the body region 215. The conductive layer 2172 or 2172' serves as an electrical contact of the gate 217 or 217', and is formed on the dielectric layer 2171 or 2171' and in contact with the dielectric layer 2171 or 2171'. The spacer layer 2173 or 2173' is formed out of two sides of the conductive layer 2172 or 2172', as an electrically insulative layer of the gate 217 or 217'. In on embodiment, in the LDMOS device LT1, the source 218 is electrically connected to the body contact 216 via a metal silicide layer (not shown), and in the LDMOS device LT2, the source 218' is electrically connected to the body contact 216 via a silicon metal layer (not shown).

In addition, the term "high voltage device" or "high voltage semiconductor device" means that, when the device operates in normal operation, the voltage applied to the drain is higher than a specific voltage, such as 5V; for devices of different high voltages, a lateral distance (distance of the drift region 212b) between the body region 215 and the drain 219' can be determined according to the operation voltage that the device is designed to withstand during normal operation, which is known to a person having ordinary skill in the art, so the details thereof are not redundantly explained here.

As shown in FIG. 3C, in a part of the first top metal line 221a near the power supply input end 220, the first current Iin1 is divided into a sub-current Iin11 and a sub-current Iin12. The sub-current Iin11 flows from the first top metal line 221a through a metal plug 222a1 and a metal line 223a1, to the drain 219. On the other hand, the sub-current Iin12 flows from the first top metal line 221a through a metal plug 222a2 and a metal line 223a2, to the drain 219'. When the semiconductor device 210 is ON, a conduction current Ic11 flows from the drain 219 through a channel formed within the semiconductor layer, to the source 218, whereas, a conduction current Ic12 flows from the drain 219' through another channel formed within the semiconductor layer, to the source 218'.

Please refer to FIG. 3D. As shown in FIG. 3D, in a part of the second top metal line 221b near the power supply input end 220, the second current Iin2 is divided into the sub-current Iin21 and the sub-current Iin22. The sub-current Iin21 flows from the second top metal line 221b through a metal plug 222b1 and a metal line 223b1, to the drain 219. On the other hand, the sub-current Iin22 flows from the second top metal line 221b through a metal plug 222b2 and a metal line 223b2, to the drain 219'. When the semiconductor device 210 is ON, the conduction current Ic21 flows from the drain 219 through the channel formed within the semiconductor layer, to the source 218, whereas, the conduction current Ic22 flows from the drain 219' through another channel formed within the semiconductor layer, to the source 218'.

Please refer to FIG. 3E, which shows a cross sectional view of the switch 21 taken along E-E' line of FIG. 3A. After the conduction current Ic11 flows from the drain 219 to the source 218, a sub-current Iin31 flows from the source 218 through a metal plug 227a1, a metal line 226a, to a metal plug 225a. After the conduction current Ic12 flows from the drain 219' to the source 218', a sub-current Iin32 flows from the source 218' through a metal plug 227a2, a metal line 226a, to a metal plug 225a. The sub-current Iin31 and the sub-current Iin32 merge to become a third current Iin3. Eventually, the third current Iin3 flows to the phase node PH via the third top metal line 224a.

Figure 3F:
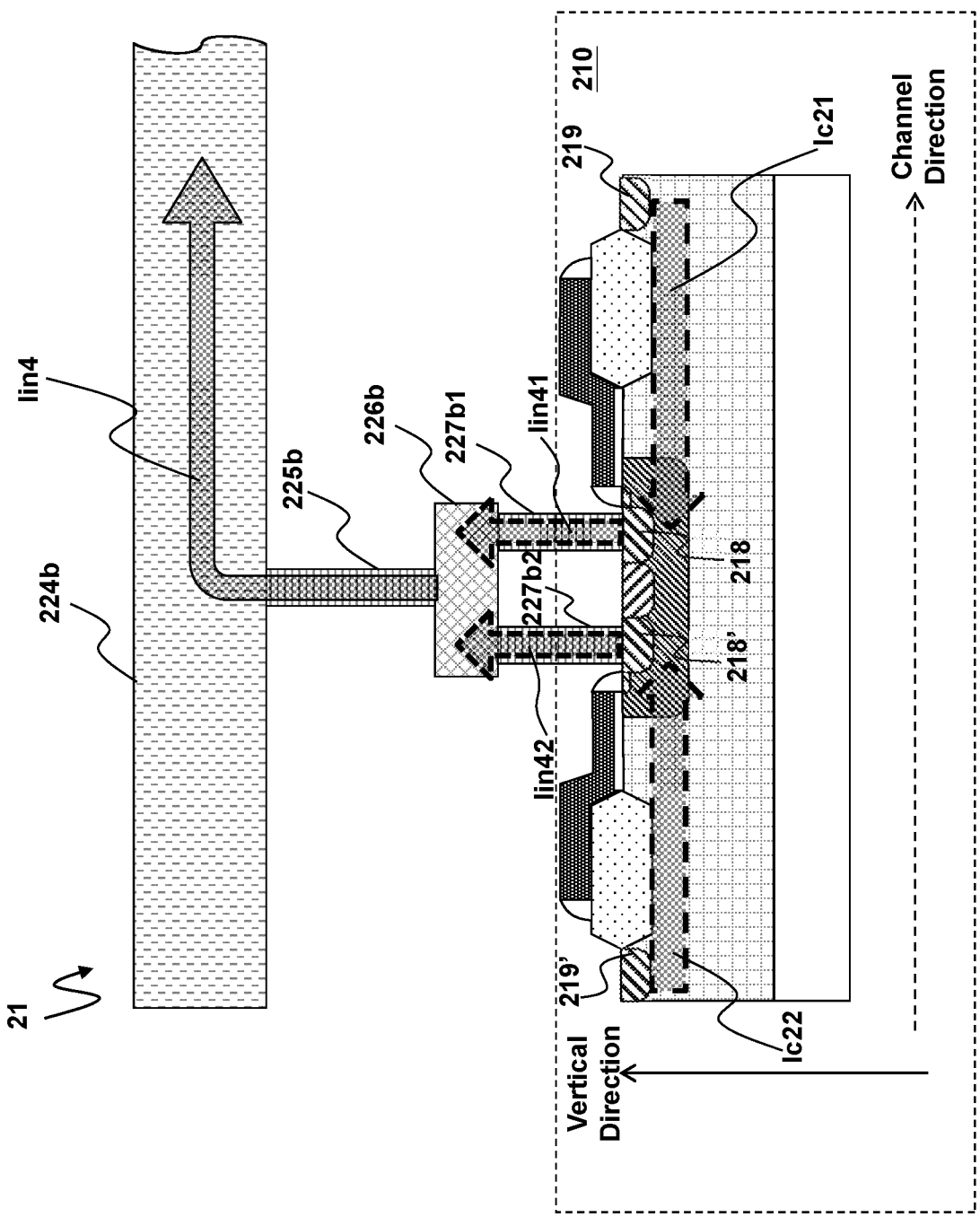
FIG. 3F shows a cross sectional view of a switch capable of decreasing parasitic inductance taken along F-F' line of FIG. 3A.

Please refer to FIG. 3F, which shows a cross sectional view of the switch 21 taken along F-F' line of FIG. 3A. After the conduction current Ic21 flows from the drain 219 to the source 218, a sub-current Iin41 flows from the source 218 through a metal plug 227b1, a metal line 226b, to a metal plug 225b. After the conduction current Ic22 flows from the drain 219' to the source 218', a sub-current Iin42 flows from the source 218' through a metal plug 227b2, a metal line 226b, to a metal plug 225b. The sub-current Iin41 and the sub-current Iin42 merge to become a fourth current Iin4. Eventually, the fourth current Iin4 flows to the phase node PH via the fourth top metal line 224b.

Figure 4A:
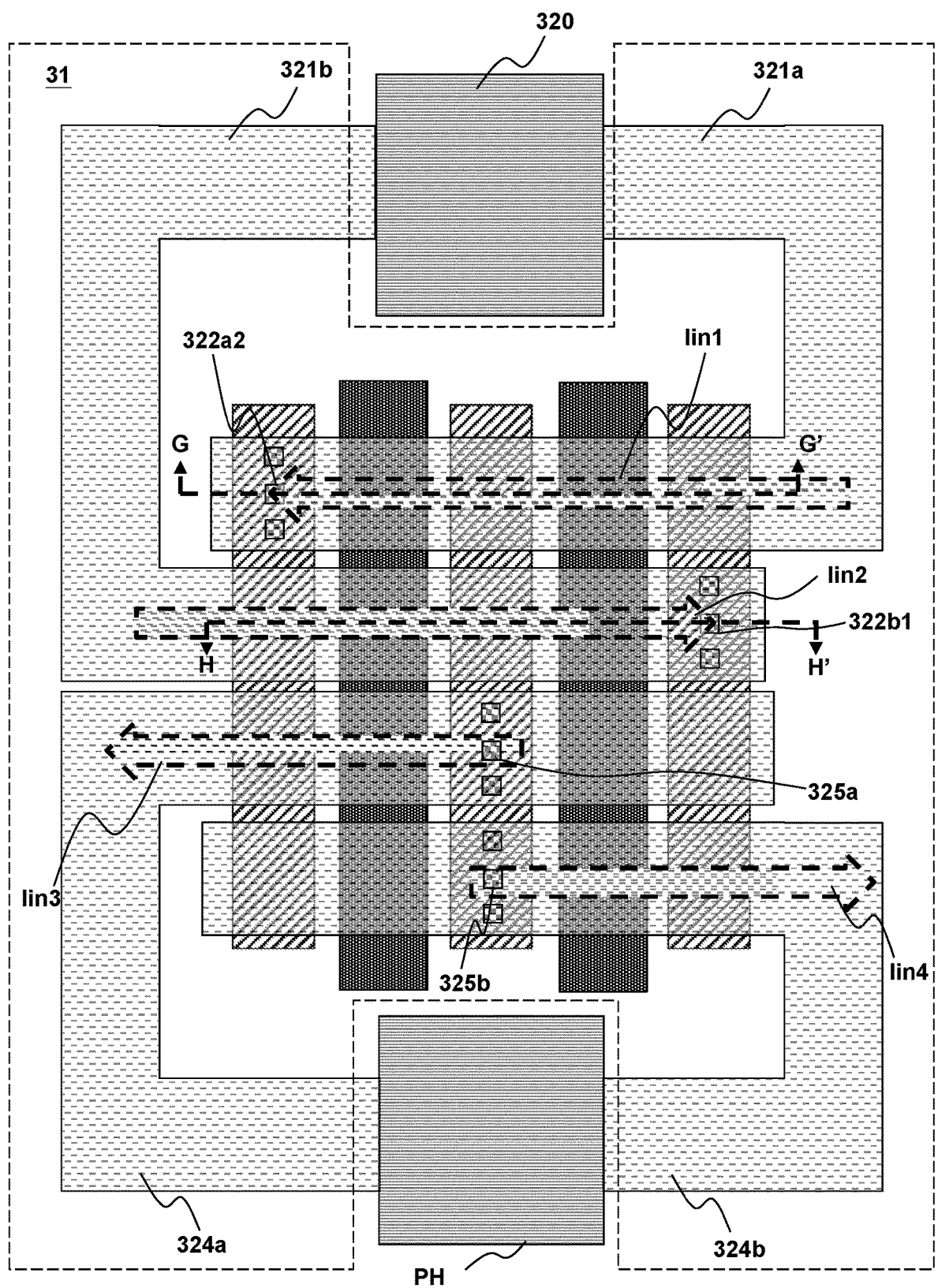
FIG. 4A shows a top view of a switch capable of decreasing parasitic inductance according to another embodiment of the present invention.

Please refer to FIG. 4A, which shows a top view of a switch 31 capable of decreasing parasitic inductance according to another embodiment of the present invention. A power supply input end 320, a first top metal line 321a, a second top metal line 321b, a third top metal line 324a and the fourth top metal line 324b and a phase node PH of this embodiment shown in FIG. 4A is similar to the power supply input end 220, the first top metal line 221a, the second top metal line 221b, the third top metal line 224a and the fourth top metal line 224b and the phase node PH of the embodiment shown in FIG. 3A, so the details thereof are not redundantly repeated here. This embodiment shown in FIG. 4A is different from the embodiment shown in FIG. 3C in that: this embodiment has a less number of metal plugs, namely, metal plugs 322a2, 322b1, 325a and 325b.

Figure 4B:
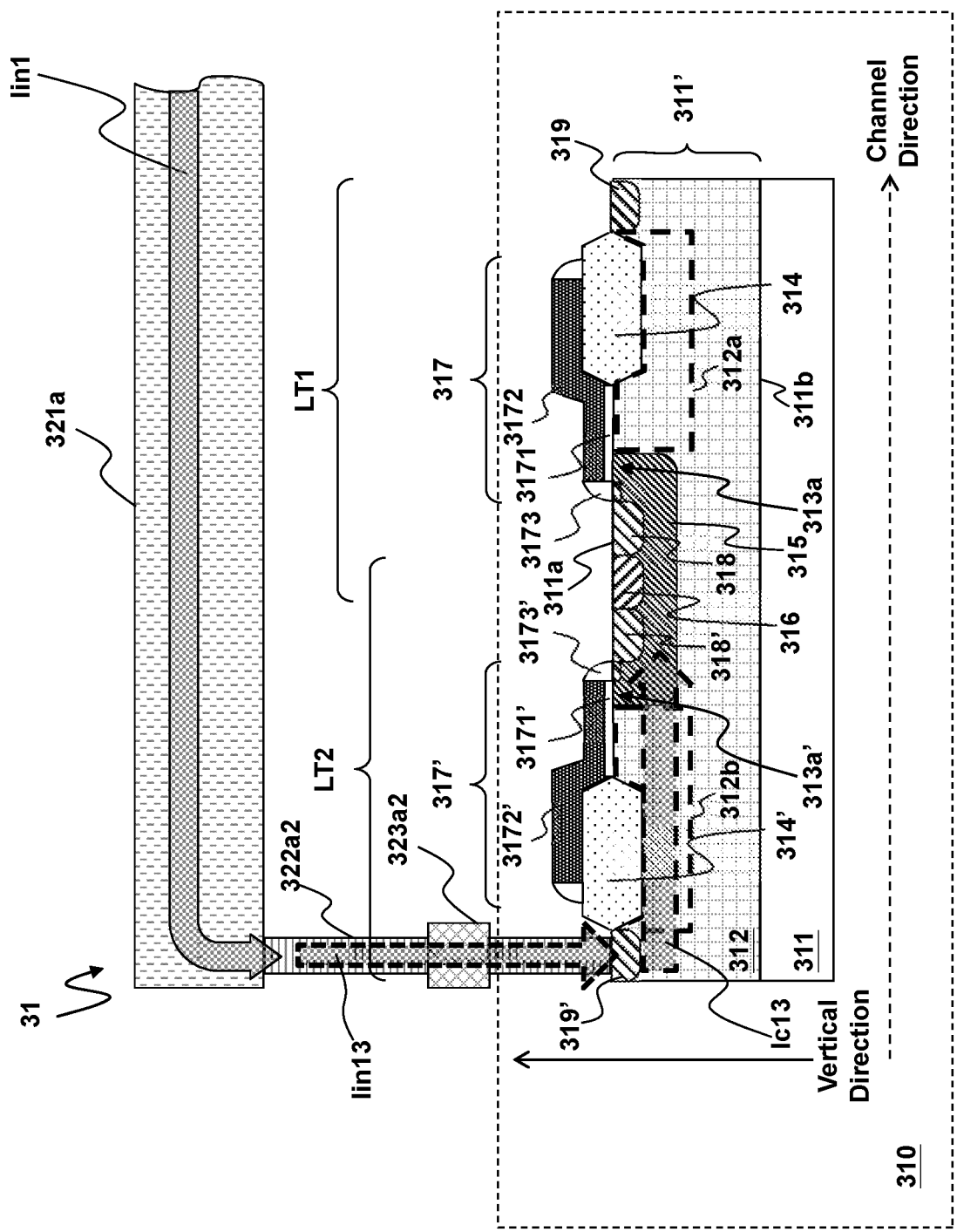
FIG. 4B shows a cross sectional view of a switch capable of decreasing parasitic inductance taken along G-G' line of FIG. 4A.
Figure 4C:
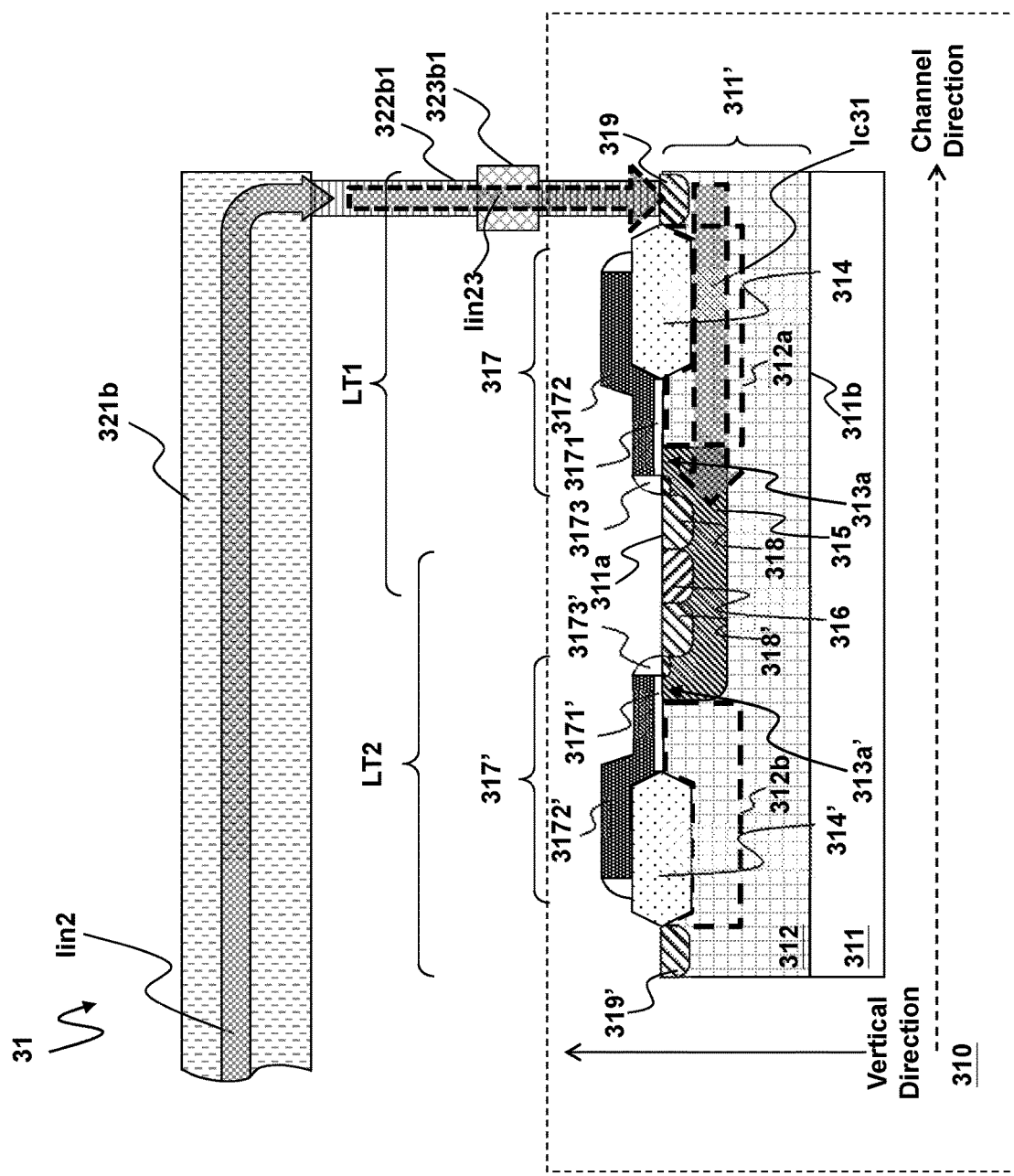
FIG. 4C shows a cross sectional view of a switch capable of decreasing parasitic inductance taken along H-H' line of FIG. 4A.

Please refer to FIG. 4B and FIG. 4C. FIG. 4B shows a cross sectional view of the switch 31 taken along G-G' line of FIG. 4A. FIG. 4C shows a cross sectional view of the switch 31 taken along H-H' line of FIG. 4A. Please refer to FIG. 4A and FIG. 3B along with FIG. 4B and FIG. 4C. As shown in FIG. 4A and FIG. 3B, the switch 31 the present invention includes: a semiconductor device 310, a first top metal line 321a and a second top metal line 321b. Please refer to FIG. 4A along with FIG. 4B. The first top metal line 321a is configured to electrically connect a power supply input end 320 and a current inflow end of the semiconductor device 310 (e.g., a drain 319'). Please refer to FIG. 4A along with FIG. 4C. The second top metal line 321b is configured to electrically connect the power supply input end 320 and the current inflow end of the semiconductor device 310 (e.g., a drain 319). As shown in FIG. 4A, in one embodiment, the second top metal line 321b and the first top metal line 321a are formed at a same elevation level. As shown in FIG. 4A, in one embodiment, a first part of the first top metal line 321a is arranged in parallel and adjacent to a second part of the second top metal line 321b.

As shown in FIG. 4A, when the semiconductor device 310 is in an ON operation, an input current outflows from the power supply input end 320, and the input current is divided into a first current Iin1 and a second current Iin2. The first current Iin1 and the second current Iin2 flow through the first part and the second part, respectively. And, when the first current Iin1 and the second current Iin2 flow through the first part and the second part, respectively, the first current Iin1 and the second current Iin2 flow opposite to each other, thus reducing a first total parasitic inductance of the first top metal line 321a and the second top metal line 321b.

As shown in FIG. 4A, the switch 31 further comprises: a third top metal line 324a and a fourth top metal line 324b. Please refer to FIG. 4A and FIG. 4B. The third top metal line 324a is configured to electrically connect a current outflow end of the semiconductor device 310 (e.g., a source 318 and a source 318') and a node (e.g., a phase node PH). Please refer to FIG. 4A and FIG. 4C. The fourth top metal line 324b is configured to electrically connect the current outflow end (e.g., the source 318 and the source 318') and the node (e.g., the phase node PH). In one embodiment, the fourth top metal line 324b and the third top metal line 324a are formed at a same elevation level. As shown in FIG. 4A, a third part of the third top metal line 324a is arranged in parallel and adjacent to a fourth part of the fourth top metal line 324b.

As shown in FIG. 4A, when the semiconductor device 310 is in the ON operation, a conduction current outflows from the current outflow end (e.g., the source 318 and the source 318'), and the conduction current is divided into a third current Iin3 and a fourth current Iin4. The third current Iin3 and the fourth current Iin4 flow through the third part and the fourth part, respectively. When the third current Iin3 and the fourth current Iin4 flow through the third part and the fourth part, respectively, the third current Iin3 and the fourth current Iin4 flow opposite to each other, to reduce a second total parasitic inductance of the third top metal line 324a and the fourth top metal line 324b. As shown in FIG. 4A, in one embodiment, the third top metal line 324a and the second top metal line 321b are formed at a same elevation level. As shown in FIG. 4A, in one embodiment, the third part of the third top metal line 324a is arranged in parallel and adjacent to the second part of the second top metal line 321b. As shown in FIG. 4A, when the semiconductor device 310 is in the ON operation, the third current Iin3 and the second current Iin2 flow through the third part and the second part, respectively. When the third current Iin3 and the second current Iin2 flow through the third part and the second part, respectively, the third current Iin3 and the second current Iin2 flow opposite to each other, to reduce a third total parasitic inductance of the third top metal line 324a and the second top metal line 321b. In one embodiment, the first top metal line 321a, the second top metal line 321b, the third top metal line 324a and the fourth top metal line 324b are all formed at a same elevation level. In one embodiment, the power supply input end 320 and the node (e.g., the phase node PH) are formed at a same elevation level. In one embodiment, the switch 31 is an upper gate switch in a buck switching regulator. In another embodiment, the switch 31 is a lower gate switch in a boost switching regulator.

Please refer to FIG. 4B. The switch 31 of the present invention includes a semiconductor device 310, which is configured to electrically connect the current inflow end of the semiconductor device 310 (e.g., the drain 319 and the drain 319') with the current outflow end of the semiconductor device 310 (e.g., the source 318 and the source 318') according to the control voltage, so as to turn ON the semiconductor device 310. The semiconductor device 310 of this embodiment shown in FIG. 4B is similar to the semiconductor device 210 of the embodiment shown in FIG. 3C, so the details thereof are not redundantly repeated here.

As shown in FIG. 4B, in a part of the first top metal line 221a away from the power supply input end 220, the first current Iin1 directly flows into the metal plug 322a2. The sub-current Iin13 flows through the metal plug 322a2 and the metal line 323a2, to the drain 319'. Please refer to FIG. 4B. When the semiconductor device 310 is ON, the conduction current Ic13 flows from the drain 319' through a channel formed within the semiconductor layer, to the source 318'.

Please refer to FIG. 4C. As shown in FIG. 4C, in a part of the second top metal line 321b away from the power supply input end 320, the second current Iin2 directly flows into the metal plug 322b1. The sub-current Iin23 flows through the metal plug 322b1 and the metal line 323b1, to the drain 319. When the semiconductor device 310 is ON, the conduction current Ic31 flows from the drain 319 through the channel formed within the semiconductor layer, to the source 318.

One advantage of the present invention superior to the prior art is that: according to the present invention, taking the embodiment shown in FIG. 3B as an example, by arranging two top metal lines wherein the two currents flow opposite to each other, while a part of one top metal line is adjacent to and parallel to a part of the other top metal line, the parasitic inductances generated by the two currents in the two metal lines can cancel each other, to greatly reduce the parasitic inductance.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A switch capable of decreasing parasitic inductance, comprising:
   a semiconductor device, which is configured to electrically connect a current inflow end of the semiconductor device with a current outflow end of the semiconductor device according to a control voltage, so as to turn ON the semiconductor device;
   a first top metal line, which is configured to electrically connect a power supply input end and the current inflow end; and
   a second top metal line, which is configured to electrically connect the power supply input end and the current inflow end, wherein the second top metal line and the first top metal line are formed at a same elevation level, and wherein a first part of the first top metal line is arranged in parallel and adjacent to a second part of the second top metal line;
   wherein when the semiconductor device is in an ON operation, an input current outflows from the power supply input end, and the input current is divided into a first current and a second current;
   wherein the first current and the second current flow through the first part and the second part, respectively, and wherein when the first current and the second current flow through the first part and the second part, respectively, the first current and the second current flow opposite to each other, to reduce a first total parasitic inductance of the first top metal line and the second top metal line.

2. The switch capable of decreasing parasitic inductance of claim 1, further comprising:
   a third top metal line, which is configured to electrically connect the current outflow end and a node; and
   a fourth top metal line, which is configured to electrically connect the current outflow end and the node, wherein the fourth top metal line and the third top metal line are formed at a same elevation level, and wherein a third part of the third top metal line is arranged in parallel and adjacent to a fourth part of the fourth top metal line;
   wherein when the semiconductor device is in the ON operation, a conduction current outflows from the current outflow end, and the conduction current is divided into a third current and a fourth current;
   wherein the third current and the fourth current flow through the third part and the fourth part, respectively, and wherein when the third current and the fourth current flow through the third part and the fourth part, respectively, the third current and the fourth current flow opposite to each other, to reduce a second total parasitic inductance of the third top metal line and the fourth top metal line.

3. The switch capable of decreasing parasitic inductance of claim 2, wherein the third top metal line and the second top metal line are formed at a same elevation level, and wherein the third part of the third top metal line is arranged in parallel and adjacent to the second part of the second top metal line;

wherein when the third current and the second current flow through the third part and the second part, respectively, the third current and the second current flow opposite to each other, to reduce a third total parasitic inductance of the third top metal line and the second top metal line.

4. The switch capable of decreasing parasitic inductance of claim 1, wherein the switch is an upper gate switch in a buck switching regulator.

5. The switch capable of decreasing parasitic inductance of claim 1, wherein the switch is a lower gate switch in a boost switching regulator.

6. The switch capable of decreasing parasitic inductance of claim 1, wherein the semiconductor device is a lateral diffused metal oxide semiconductor (LDMOS) device.

7. The switch capable of decreasing parasitic inductance of claim 6, wherein the LDMOS device includes:
   a well, which has a first conductivity type, and is formed in a semiconductor layer;
   a body region, which has a second conductivity type, and is formed in the semiconductor layer, wherein the body region is connected to the well in a channel direction;
   a gate, which is formed on the semiconductor layer, wherein part of the body region is vertically below the gate and is connected to the gate, so as to form an inversion current channel in the ON operation of the semiconductor device;
   a source and a drain, which have the first conductivity type, and are located at different sides out of the gate, respectively, wherein the source is located in the body region, and the drain is located in the well;
   wherein part of the well between the body region and the drain is a drift region, which serves as a drift current channel in the ON operation of the semiconductor device.

8. The switch capable of decreasing parasitic inductance of claim 2, wherein the first top metal line, the second top metal line, the third top metal line and the fourth top metal line are formed at a same elevation level; and wherein the power supply input end and the node are formed at a same elevation level.

9. The switch capable of decreasing parasitic inductance of claim 6, wherein the semiconductor device includes: a first LDMOS device and a second LDMOS device, wherein the first LDMOS device and the second LDMOS device shared a same body region and a same body contact, and wherein the first LDMOS device and the second LDMOS device are mirror arranged to each other.

10. The switch capable of decreasing parasitic inductance of claim 9, wherein each LDMOS device includes a well, a body region, a body contact, a gate, a source and a drain, and from a top view, in a channel direction, the first top metal line and the second top metal line extend across the wells, the body regions, the body contacts, the gates, the sources and the drains of the first LDMOS device and the second LDMOS device.

* * * * *